United States Patent [19]

Nishizawa et al.

[11] Patent Number: 4,616,249
[45] Date of Patent: Oct. 7, 1986

[54] SOLID STATE IMAGE PICK-UP ELEMENT OF STATIC INDUCTION TRANSISTOR TYPE

[75] Inventors: Jun-ichi Nishizawa, Sendai; Tsutomu Nakamura, Ina, both of Japan

[73] Assignee: Olympus Optical Co., Ltd., Tokyo, Japan

[21] Appl. No.: 555,988

[22] Filed: Nov. 29, 1983

[30] Foreign Application Priority Data

Dec. 14, 1982 [JP] Japan .................... 57-217715

[51] Int. Cl.$^4$ .................... H01L 27/14; H01L 31/00
[52] U.S. Cl. .................... 357/30
[58] Field of Search .................... 357/30, 47, 48

[56] References Cited

U.S. PATENT DOCUMENTS 4,445,130  4/1984  Poulain et al. .................... 357/30

Primary Examiner—James W. Davie
Assistant Examiner—Robert E. Wise
Attorney, Agent, or Firm—Parkhurst & Oliff

[57] ABSTRACT

In a solid state image pick-up element of static induction transistor type having an n+ source region, an n+ drain region, an n− channel region formed between the source and drain regions and a p+ signal storing gate region formed in the channel region for storing charge carriers induced in the channel region in response to light input, an n+ resetting region is formed in the signal storing gate region to form a p-n junction therebetween and an electrode is provided on the resetting region to control a bias voltage applied to the resetting region. Upon a resetting operation, when the p-n junction is selectively biased in the forward direction, it is possible to completely discharge charge carriers stored in the gate region through the resetting region in an accurate manner. Since the resetting region is formed in the signal storing gate region, the integration density is not reduced.

5 Claims, 4 Drawing Figures

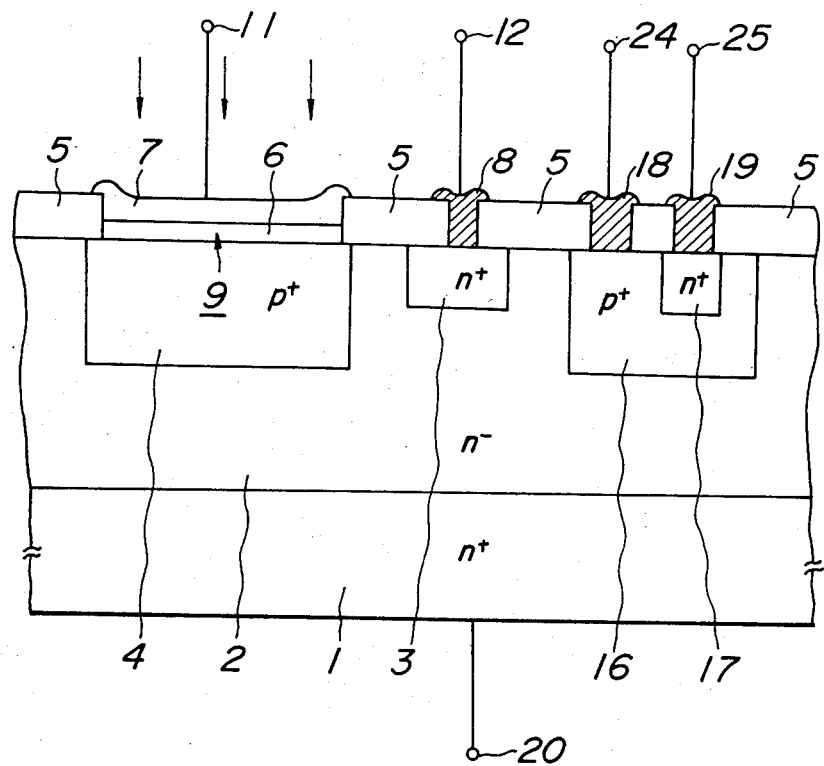
FIG_3
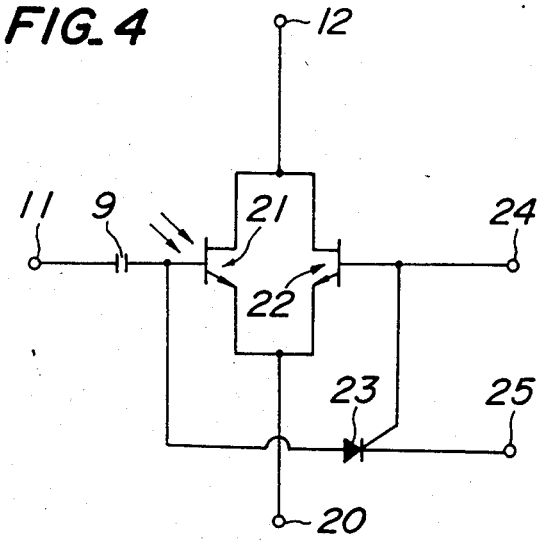
FIG_4

SOLID STATE IMAGE PICK-UP ELEMENT OF STATIC INDUCTION TRANSISTOR TYPE

BACKGROUND OF THE INVENTION

The present invention relates to a solid state image pick-up element comprising a static induction transistor (hereinafter, abbreviated as SIT) having a photoelectrically converting function and a charge amplifying function.

Regarding a conventional solid state image pick-up element, there have been proposed a charge transfer device such as CCD (charge coupled devices) and a MOS transistor, but these elements have various disadvantages such as leakage of charge during the charge transferring operation, a low sensitivity of light detection and a difficulty in increasing the integration density. Recently, in order to eliminate the disadvantages mentioned above, there has been proposed a solid state image pick-up element comprising a SIT.

FIG. 1 shows a typical solid state image pick-up element of gate-capacitance type utilizing a SIT. In FIG. 1, on an n+ substrate 1 is deposited an n− epitaxial layer 2 forming an n− channel region. The substrate 1 constitutes a source region of the SIT. In the channel region 2, are formed an n+ drain region 3 and a p+ signal storing gate region 4. Moreover, on the channel region 2 is formed an insulating layer 5, and on the signal storing gate region 4, is formed a transparent insulating layer 6 on which is transparent gate electrode 7 is arranged. Further, on the drain region 3, is formed a drain electrode 8. In this manner, the gate capacitance 9 consists signal storing gate region 4, transparent insulating layer 6 and transparent gate electrode 7.

In the solid state image pick-up element of gate-capacitance type, the channel region 2 has been already depleted when the element is in a steady state in which no light is made incident thereon. Therefore, current does not flow between the source and the drain regions, even if a forward bias is applied therebetween.

When light input 10 is made incident upon the gate region 4 through the transparent electrode 7 and the transparent insulating layer 6, electron-hole pairs are generated in the channel region 2. In this case, the electrons flow into the grounded source region 1 and the holes are stored in the signal storing gate region 4. In this manner, the gate capacitance 9 is charged so that a potential at the signal storing gate terminal 11 is increased by $\Delta V_G$. If it is assumed that the gate capacitance 9 is $C_G$ and an amount of charge carriers stored in the signal storing gate region 4 in response to the incident light amount is $Q_L$, the gate potential $\Delta V_G$ can be expressed by $\Delta V_G = Q_L/C_G$. Moreover, if a gate readout pulse is supplied to the signal storing gate 11 after a lapse of a certain storing period, the gate potential becomes above that of the gate readout pulse by $\Delta V_G$, and the potential difference between the signal storing gate region 4 and the drain region 3 is decreased. Therefore, since the depletion layer is decreased, the drain current corresponding to the incident light amount flows between the source region 1 and the drain region 3 and is derived from the drain terminal 12. Since the SIT has an amplifying function, the gate potential is increased by an amplification factor and therefore, the large drain current is obtained.

As mentioned above, the solid state image pick-up element of SIT type has various advantages such as a simple construction and an amplifying function. There have been proposed various methods for discharging the signal charge stored in the signal storing gate region 4. In one known method, the stored charge is discharged simultaneously with the readout operation by applying a readout pulse to the gate terminal 11, and in another known method, the stored charge flows away by means of a switching transistor as disclosed in Japanese Patent Application Laid-Open Publication No. 15,229/80. However, in the former method, there occurs an inherent problem in effecting the signal readout operation together with the reset operation, and further the reset operation might be affected by characteristics of the readout pulse. In the latter method, the reset operation can be achieved accurately, but it is difficult to attain a high integration density because the construction becomes very complicated.

SUMMARY OF THE INVENTION

The present invention has for its object to eliminate the drawbacks mentioned above and to provide a solid state image pick-up element which can perform an accurate reset operation of a signal charge stored in a gate region using a simple construction without decreasing the integration density.

According to the invention, a solid state image pick-up element of the static induction transistor type comprises a semiconductor body;

a first main electrode region of one conductivity type formed in said semiconductor body;

a second main electrode region of one conductivity type formed in the semiconductor body;

a channel region of one conductivity type formed in the semiconductor body between said first and second main electrode regions;

a signal storing gate region of a second conductivity type formed in said channel region for storing charge carriers induced in the channel region in response to light input;

a resetting region of one conductivity type formed in said signal storing gate region to construct a p-n junction therebetween; and means for selectively biasing said p-n junction in a forward direction to discharge charge carriers stored in said signal storing gate region through said resetting region.

According to further aspect of the invention, a solid state image pick-up element of static induction transistor type comprises a semiconductor body;

a first main electrode region of one conductivity type formed in said semiconductor body;

a second main electrode region of one conductivity type formed in said semiconductor body;

a channel region of one conductivity type formed in the semiconductor body between said first and second main electrode regions;

a signal storing gate region of a second conductivity type formed in said channel region for storing charge carriers induced in the channel region in response to light input;

an isolating gate region arranged in said channel region for isolating the elements from adjacent element;

a resetting region of one conductivity type formed in said isolating region to construct a p-n junction therebetween; and means for selectively biasing said p-n junction in a forward direction to discharge charge carriers stored in said signal storing gate region through the channel region, the isolating gate region and the resetting region.

BRIEF DESCRIPTION OF THE DRAWINGS

FIG. 3 is a cross sectional view depicting another embodiment of the solid state image pick-up element according to the invention; and FIG. 4 is an equivalent circuit of the solid state image pick-up element illustrated in FIG. 3.

DESCRIPTION OF THE PREFERRED EMBODIMENTS

Figure 1:
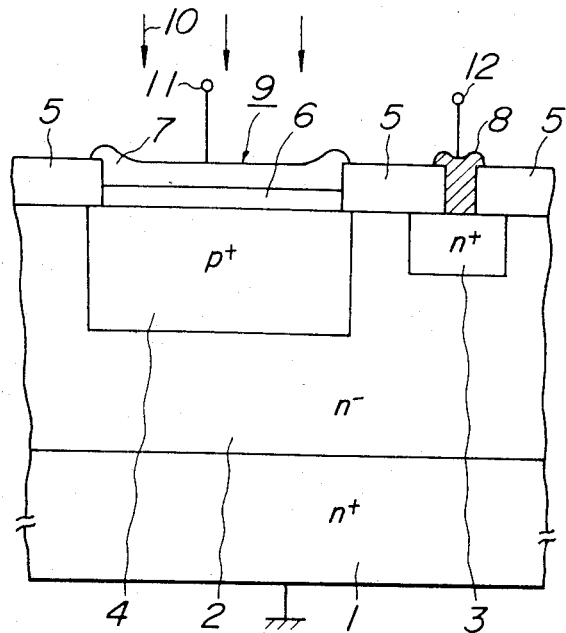
FIG. 1 is a cross sectional view showing a conventional image pick-up element of gate capacitance type.
Figure 2:
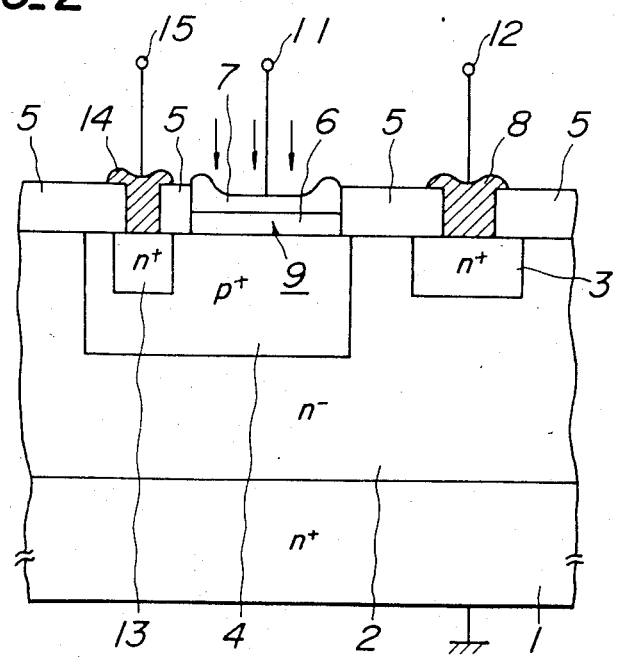
FIG. 2 is a cross sectional view illustrating one embodiment of the solid state image pick-up element according to the invention.

FIG. 2 is a cross sectional view showing one embodiment of the solid state image pick-up element according to the invention. Portions in FIG. 2 similar to those shown in FIG. 1 are denoted by the same reference numerals used in FIG. 1.

The solid state image pick-up element shown in FIG. 2 comprises an n+ substrate 1 constituting a first main electrode region, i.e. a source region, an n− epitaxial layer 2 constituting a channel region formed on the substrate 1, an n+ region 3 forming a second main electrode, i.e. a drain region and a p+ signal storing gate region 4 constituting a sub-electrode region. The drain region 3 and signal storing gate region 4 being formed in a surface of the channel region 2 by diffusion. In a surface of the gate region, an n+ resetting region 13 which has an opposite conductivity to that of the gate region is formed by diffusion so as to construct a p-n junction therebetween. Moreover, an insulating layer 5 is formed on the channel region 2, and on part of the signal storing gate region 4 is arranged a transparent insulating layer 6 on which a transparent electrode 7 is further applied. In this case, the gate capacitance 9 comprises the signal storing gate region 4, the transparent insulating layer 6 and the transparent electrode 7. Further in this embodiment, an electrode 8 is formed on the drain region 3 and also an electrode 14 is formed on the resetting region 13.

In the solid state image pick-up element mentioned above, during the period for storing the charge into the signal storing gate region 4 as well as the reading-out period, the n+ resetting region 13 is maintained at a floating potential or is set in a reverse-biased state with respect to the signal storing gate region 4. Under such conditions, charge storing and reading-out operations of the solid state image pick-up element according to the invention are identical with those of the conventional image pick-up element shown in FIG. 1.

The case of effecting the reset operation i.e. the charge discharging operation, the p-n junction between the n+ region 13 and the signal storing gate region 4 is selectively biased in a forward direction, and then the signal charge stored in the gate region 4 is discharged through the resetting region 13, the electrode 14 and the terminal 15. After that, the solid state image pick-up element can be prepared for the next signal storing operation.

FIG. 3 shows another embodiment of the solid state image pick-up element according to the invention. The image pick-up element comprises an isolation gate region for electrically isolating the relevant element from adjacent SIT elements. Portions in FIG. 3 similar to those shown in FIG. 2 are denoted by the same reference numerals as used in FIG. 2. In this embodiment, an n− epitaxial channel region 2 is formed on an n+ source region 1 constituting the first main electrode region, and also an n+ drain region 3 constituting the second main electrode region is formed in a surface of the channel region 2. Further, in the surface of the channel region 2 are formed a p+ signal storing gate region 4 constituting the first sub-electrode region and a p+ isolation gate region 16 constituting the second sub-electrode region. In a surface of isolation gate region 16, an n+ resetting region 17 which has the opposite conductivity to that of the gate regions is formed thereby defining a p-n junction therebetween. Moreover, an insulating layer 5 is formed on the channel region 2, and on the signal storing gate region 4 is arranged a transparent insulating layer 6 on which a transparent electrode 7 is further arranged. Also in this case, the gate capacitance 9 comprises of the signal storing gate region 4, the transparent insulating layer 6 and the transparent electrode 7. Further in this embodiment, electrodes 8, 18 and 19 are formed on the drain region 3, a part of the separation gate region 16 and the resetting region 17, respectively.

FIG. 4 is an equivalent circuit of the solid state image pick-up element illustrated in FIG. 3. In FIG. 4, two SIT elements 21 and 22 are arranged in parallel between the drain terminal 12 and the source terminal 20. In this embodiment, the SIT element 21 includes the signal electrode gate region 4 and the other SIT element 22 includes the isolation gate region 16. Moreover, p+-n−-p+-n+ thyristor 23 shown in FIG. 4 is equivalently constituted by the signal storing gate region 4, the channel region 2, the isolation gate region 16 and the resetting region 17.

In this embodiment, during the period for storing the charge into the signal storing gate 4 and the reading-out period, the n+ resetting region 17 is maintained in a floating state or is set in a reverse-biased state with respect to the isolating gate region 16. Under such conditions, charge storing and reading-out operations of the solid state image pick-up element according to the invention are identical with those of the image pick-up element shown in FIG. 2.

In the case of effecting the reset operation, the isolating gate region 16 is biased through the isolation gate terminal 24 at a sufficiently lower potential than that of the signal storing gate region 4 while the potential of the drain region 3 is maintained in a floating state, and the p-n junction between the isolating gate region 16 and the resetting region 17 is biased in the forward direction. If such conditions are achieved, the p+-n−-p+-n+ thyristor 23 comprising of the p+ signal storing region 4, the n− channel region 2, the p+ isolating gate region 16 and the n+ resetting region 17 is on and thus it is possible to discharge the signal charge stored in the signal storing gate region 4 from the reset terminal 25 through the channel region 2, the isolating gate region 16, the resetting region 17 and the electrode 19. In this case, since the p-n junction between the isolating gate region 16 and the n+ region 17 is biased in the forward direction, it is also possible to discharge the signal charge stored in the isolation gate region 16, and thus the reset operation of the isolation gate can be performed at the same time. Therefore, the solid state image pick-up element can be prepared for the next exposure.

As mentioned above, according to the invention, it is possible to perform the reset operation of the signal storing gate and the isolation gate accurately by means of the thyristor without decreasing the integration density.

The present invention is not limited to the embodiments mentioned above, but various alternations and modifications are possible. For example, it is possible to form the first and second main electrode regions as the drain region and the source region, respectively. Moreover, the present invention can be preferably applied to a solid state image pick-up element which does not utilize a gate capacitance for storing the signal charge.

What is claimed is:

1. A solid state image pick-up element of static induction transistor type comprising
   a semiconductor body;
   a first main electrode region of one conductivity type formed in said semiconductor body;
   a second main electrode region of one conductivity type formed in said semiconductor body;
   a channel region of one conductivity type formed in the semiconductor body between said first and second main electrode regions;
   a signal storing gate region of a second conductivity type formed in said channel region for storing charge carriers induced in said channel in response to light input;
   an isolating gate region arranged in said channel region for isolating said element from adjacent elements;
   a resetting region of one conductivity type formed in said isolating region to construct a p-n junction therebetween; and
   means for selectively biasing said p-n junction in a forward direction to discharge charge carriers stored in said signal storing gate region through said channel region, said isolating gate region and said resetting region.

2. A solid state image pick-up element according to claim 1, further comprising a transparent insulating layer provided on said signal storing gate region and a transparent electrode applied on said transparent insulating layer to form a gate capacitance.

3. A solid state image pick-up element according to claim 1, wherein said semiconductor body comprises a semiconductor substrate of one conductivity type constituting said first main electrode region and an epitaxial layer of one conductivity type constituting said channel region and being formed on said substrate.

4. A solid state image pick-up element according to claim 3, wherein said second main electrode region being formed in a surface of the epitaxial layer, said signal storing and isolating gate regions being formed in the surface of the epitaxial layer on respective sides of said second main electrode, and said resetting region being formed in a surface of said isolating gate region.

5. A solid state image pick-up element according to claim 4, wherein said first main electrode region constitutes a source region and said second main electrode region constitutes a drain region.

* * * * *